United States Patent [19]

O'Brien et al.

[11] 3,840,889

[45] Oct. 8, 1974

[54] LASER DIODE PACKAGE FORMED OF CERAMIC AND METAL MATERIALS HAVING HIGH ELECTRICAL AND THERMAL CONDUCTIVITY

[75] Inventors: James Thomas O'Brien, Leola; Paul Nyul, New Holland, both of Pa.

[73] Assignee: RCA Corporation, New York, N.Y.

[22] Filed: July 11, 1973

[21] Appl. No.: 378,271

[52] U.S. Cl. ........................ 357/81, 357/18, 357/72, 331/94.5

[51] Int. Cl. ............................ H01l 3/00, H01l 5/00

[58] Field of Search ............ 317/234, 1, 4, 4.1, 235, 317/27; 331/94.5 H

[56] References Cited

UNITED STATES PATENTS

| | | | |
|---|---|---|---|
| 2,969,487 | 1/1961 | Bourassa | 317/234 G |
| 3,117,179 | 1/1964 | Brown | 317/234 A |
| 3,199,000 | 8/1965 | Nippert | 317/234 A |
| 3,303,432 | 2/1967 | Garfinkel et al. | 317/235 N |
| 3,351,698 | 11/1967 | Marinace | 317/235 N |
| 3,354,316 | 11/1967 | Deverall | 317/234 G |
| 3,408,732 | 11/1968 | Smith et al. | 317/234 G |
| 3,708,732 | 1/1973 | Faust | 317/234 G |
| 3,796,881 | 3/1974 | Roberts | 317/234 H |

*Primary Examiner*—Andrew J. James
*Attorney, Agent, or Firm*—Glenn H. Bruestle; Donald S. Cohen

[57] ABSTRACT

A laser diode package which has little inherent induction at high frequency, due to its size and geometry, and allows operation of the diode at reduced temperature without affecting the temperature of the optically coupled medium.

8 Claims, 5 Drawing Figures

PATENTED OCT 8 1974 3,840,889

LASER DIODE PACKAGE FORMED OF CERAMIC AND METAL MATERIALS HAVING HIGH ELECTRICAL AND THERMAL CONDUCTIVITY

BACKGROUND OF THE INVENTION

This invention relates to a laser diode package and more particularly to a laser diode package permitting high frequency operation.

Laser diodes are bodies of semiconductor material, which include regions of opposite conductivity type forming a PN junction therebetween. When the PN junction is properly biased, light is emitted from the emitting surface of the diode through the recombination of pairs of oppositely charged carriers.

In the case of such laser diodes used in some types of communication systems, the diode may have its most advantageous application at a high frequency of operation, such as from 1 to 2.5 MHz and above. The higher frequencies and narrow pulse widths bring about a higher laser diode peak output power and allow carriage of more bits of information. It is desirable that the laser diode package have a low inherent inductance when operating at these high frequencies.

Additionally, it is beneficial to operate a laser diode at a low threshold current, which can be accomplished by the lowering of the operating temperature. While the laser diode package is subjected to a lowering of the operating temperature, it is desirable that the transmitting element optically coupled to the laser diode package not be subjected to such temperature change.

SUMMARY OF THE INVENTION

A laser diode package includes a base plate, an insulating ring mounted on the base plate and a terminal ring mounted on the insulator ring. A mounting post on said base plate extends through said insulator ring. A laser diode is mounted on said mounting post with its emitting surface facing away from said base plate. The laser diode has adjacent regions of opposite conductivity forming a PN junction therebetween. One of the regions is electrically connected to the mounting post and the other region is electrically connected to the terminal ring.

DETAILED DESCRIPTION

Figures 1, 2, 3, 4, 5:
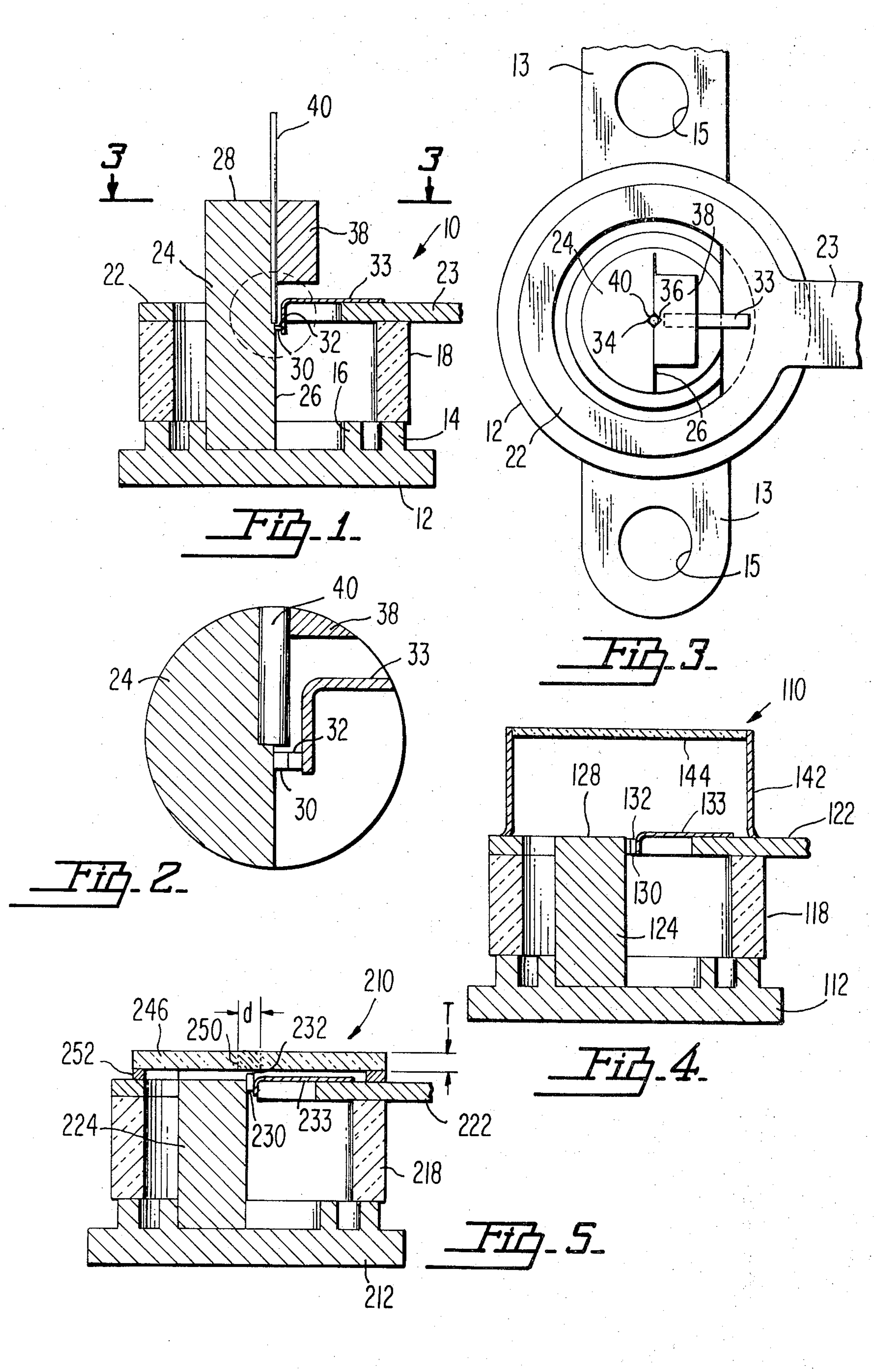
FIG. 1 is a cross-sectional view of one embodiment of the laser diode package.
FIG. 2 is an enlarged view of the encircled portion of FIG. 1.
FIG. 3 is a plane view in the direction of line 3—3 of FIG. 1.
FIG. 4 is a cross-sectional view of another embodiment of the laser diode package hermetically sealed by a cap with a glass window.
FIG. 5 is a cross-sectional view of still another embodiment of the laser diode package hermetically sealed by a glass plate.

Referring to FIG. 1, an embodiment of the laser diode package of the present invention shown herein is designated as 10. The laser diode package 10 includes a base plate 12 which should be of a metallic material of high electrical and thermal conductivity, typically oxygen-free high-conductivity copper. Base plate 12 is circular with two wings 13 extending from the circle and one mounting hole 15 going through each wing, as shown in FIG. 3. On the surface of base plate 12 are two concentric circle projections. The outer circle projection is designated as 14 and the inner circle projection is designated 16. Mounted on the outer circular projection 14 is a ceramic insulator 18. Copper and a ceramic material may have different coefficients of expansion. Thus, to provide a good ceramic-to-metal seal, free of thermal stresses, it is preferable that the ceramic insulator 18 have an inside diameter smaller than the inside diameter of outer circular projection 14 and an outside diameter larger than the outside diameter of outer circular projection 14.

Mounted on ceramic insulator 18 is a terminal ring 22 which has a tab 23 extending radially therefrom. The terminal ring 22 should be of a metallic material with good electrical conductivity and a thermal coefficient of expansion matching the thermal coefficient of expansion of the ceramic insulator 18, so as to provide a good ceramic-to-metal seal. Typically, such a material is Kovar.

A mounting post 24 is mounted on the surface of base plate 12 such that it is in contact with the side of the inner circular projection 16, and extends through the ceramic insulator 18 and the terminal ring 22. Mounting post 24 is D-shaped with a longitudinal flat surface 26 and a free end surface 28. The mounting post 24 should be of a metallic material of high electrical and thermal conductivity, typically oxygen-free high-conductivity copper.

On the flat surface 26 of mounting post 24 is attached a laser diode 30 with an emitting surface 32. As shown in FIG. 2, diode 30 is fixed to the flat surface 26 such that emitting surface 32 is facing away from the base plate 12. Diode 30 is a body of semiconductor material having two regions of opposite conductivity forming a PN junction therebetween. Laser diodes employed in the present invention may be of any type, including those having optically confining cavities such as described in the articles, "Close-Confinement Gallium Arsenide PN Junction Lasers With Reduced Optical Lase at Room Temperature," by H. Kressel, et al, RCA REVIEW, Vol, 30, No. 1, pages 106–113, March 1969, "High Order Transverse Cavity Modes in Heterojunction Diode Lasers," by I. Butler, et al, APPLIED PHYSICS LETTERS, Vol. 17, No. 9, Nov. 1, 1970, pages 403–406, and "An Efficient Large Optical Cavity Injection Laser," by H. F. Lockwood et al, APPLIED PHYSICS LETTERS, Vol. 17, No. 12, Dec. 1, 1970, pages 499–502, or may be of the structure of laser diodes shown and described in U.S. Pat. No. 3,701,047, issued Oct. 24, 1972 to S. Caplan, et al.

Mounting post 24 is one of the electrical contacts for the diode 30. The other electrical contact is terminal ring 22, with tab 23 for the purpose of external electrical connection. Electrically connecting terminal ring 22 to diode 30 is a flexible ribbon 33 of a metallic material of very high electrical conductivity, such as gold. Alternatively, the ring 22 may have an integral tab which extends into contact with the diode 30 to electrically connect the ring 22 and the diode 30.

In the flat surface 26 of the mounting post 24 is a V-groove 34, shown in FIG. 3, extending from the emitting surface 32 of the diode to the free end surface 28 of the mounting post. A portion of fiber optic 40 is secured in the V-groove 34 such that one end of the fiber optic 40 is almost contacting the emitting surface 32 of the laser diode and the remaining portion of fiber optic 40 extends beyond the free end surface 28. A relief block 38 has a V-groove 36 which mates with the V-groove 34 in the mounting post 24. The relief block 38 is attached to the mounting post 24 so that fiber optic 40 is secured between the mated V-grooves 34 and 36.

The laser diode package 10 is low in inherent inductance as a result of the size and geometry of some of the parts comprising the laser diode package 10. Due to the skin effect of electrons at high frequency, it is desirable to have circuit components of low inductance. The more surface area provided with respect to volume, the lower will be the inherent inductance of a device. Since the laser diode package 10 is of low inherent inductance, operation at high frequencies, such as from 1 to 2.5 MHz and above, is practical.

Those parts of the laser diode package 10 that are relevant to the low inherent inductance, are the base plate 12, the terminal ring 22 and the mounting post 24. When the base plate 12 has a total length of 1 inch, a total thickness of 0.1 inch, and an outside diameter of 0.5 inch, and the terminal ring 22 has an outside diameter of 0.4 inch, an inside diameter of 0.3 inch and a thickness of 0.02 inch, and the mounting post 24 has a total length of 0.3 inch with a radius of 0.11 inch, the laser diode package 10 has an inherent inductance in the range of $10^{-9}$ to $10^{-10}$ henrys.

To operate the laser diode 30 at a low threshold current, it may be necessary to lower the diode 30 to a temperature below that of room temperature. The lowering of the operating temperature can be accomplished by bolting the base plate 12 of the laser diode package 10 to a heat sink. While the diode 30 is lowered in operating temperature, it may be desirable that the medium through which travel the light pulses generated from emitting surface 32, not be subjected to this temperature change. Therefore, the fiber optic 40 extending from the laser diode package 10 allows the operating temperature of the laser diode 30, to be lowered, without subjecting to such temperature change that which is optically coupled to the end of the fiber optic 40 not in contact with the laser diode package 10.

Referring to FIG. 4, another embodiment of the laser diode package of the present invention shown therein is designated as 110. The laser diode package 110 includes several parts exactly the same as those in the prior embodiment of the laser diode package designated as 10 and shows in FIG. 1. The laser diode package 110 includes a base plate 112 on which is mounted a ceramic insulator 118. Attached to said ceramic insulator 118 is a terminal ring 122. The base plate 112 is the same as base plate 12, ceramic insulator 118 is the same as ceramic insulator 18, and terminal ring 122 is the same as terminal ring 22. A mounting post 124 with an end surface 128 is attached to the base plate 112 but it differs from mounting post 24 since it does not extend beyond terminal ring 122. Attached to mounting post 124 is a laser diode 130 with an emitting surface 132. The diode 130 includes all those types of diodes that diode 30 included, but diode 130 is attached to the mounting post 124 such that the emitting surface 132 is at the same level as end surface 128. Electrically connecting diode 130 to the terminal ring 122 is a ribbon tab 133 which is the same as ribbon tab 33.

Attached to the terminal ring 122 is a cylindrical cap 142. The cylindrical cap 142 is mounted on the terminal ring 122 is such a manner as to form a hermetic seal over the laser diode package 110. Cylindrical cap 142 has a clear glass window 144 such that light pulses generated from emitting surface 132 can be transmitted to any light transmitting medium outside the hermetically sealed laser diode package 110.

Referring to FIG. 5, another embodiment of the laser diode package of the present invention shown therein in designated as 210. The laser diode package includes several parts exactly the same as those in the laser diode package designated 110. Thus, base plate 212 is the same as base plate 112, ceramic insulator 218 is the same as ceramic insulator 118, terminal ring 222 is the same as terminal ring 122, mounting post 224 is the same as mounting post 124, laser diode 230 with emitting surface 232 is the same as laser diode 130 with emitting surface 132, and ribbon tab 233 is the same as ribbon tab 133.

Attached to terminal ring 222 is a circular glass plate 246. A metallic film 252 covers the edge of the bottom surface of circular glass plate 246. Metallic film 252 is bonded to terminal ring 222 such that the laser diode package 210 is hermetically sealed.

In the center of the circular glass plate 246 is a cylindrical glass portion 250. Cylindrical glass portion 250, which is almost contiguous to emitting surface 232, is of a fiber optic character. This fiber optic effect is the result of having the index of refraction of the cylindrical glass portion 250 greater than the index of refraction of the remainder of the circular glass plate 246 and by having the diameter, designated as *d*, of the cylindrical glass portion 250 smaller than the thickness, designated as T, of the circular glass plate 246.

The third embodiment of the present invention, laser diode package 210, allows light pulses generated from the emitting surface 232 to be transmitted through the center glass circle 250 to any light transmitting medium outside the hermetically sealed laser diode package 210.

What we claim is:

1. A laser diode package comprising:

a. a base plate of an electrically conductive metallic material;

b. an insulator ring attached to said plate;

c. a terminal ring of an electrically conductive metallic material mounted on said insulator ring;

d. a mounting post, of an electrically conductive metallic material, on said base plate and extending through said insulator ring;

e. a laser diode on said mounting post, said laser diode having a light emitting surface which faces away from said base plate, and adjacent regions of opposite conductivity forming a PN junction therebetween, one of said regions being electrically connected to said mounting post;

f. means electrically connecting the other region of said laser diode to said terminal ring.

2. The laser diode package in accordance with claim 1 in which the other region of said laser diode is electrically connected to said terminal rings by a metallic ribbon.

3. The laser diode package in accordance with claim 1 in which a tab extends radially from the terminal ring.

4. The laser diode package in accordance with claim 1 in which said mounting post extends beyond said terminal ring and has a groove in a surface thereof which extends longitudinally from the emitting surface of said diode to the free end surface of said mounting post and a fiber optic 15 secured in said groove and extends from adjacent the light emitting surface of the diode beyond the free end surface of the mounting post.

5. The laser diode package in accordance with claim 1 in which a relief block secures a fiber optic to said mounting post.

6. The laser diode package in accordance with claim 1 in which said mounting post extends only to said terminal ring and a cap is mounted on said terminal ring, said cap having a glass window which extends over the mounting post.

7. The laser diode package in accordance with claim 3 in which said cap is a flat glass plate mounted on said terminal ring and said glass plate having a metallic coating on the edge of its bottom surface and a center portion of a material with fiber optic properties, and said diode is mounted on said mounting post such that said light emitting surface is in contact with the center portion of said glass plate.

8. The laser diode package in accordance with claim 4 in which said center portion of the flat glass plate has a diameter less than the thickness of said glass plate and an index of refraction greater than the index of refraction of said glass plate.

* * * * *